United States Patent
Hanari (10) Patent No.: US 10,452,181 B2
(45) Date of Patent: Oct. 22, 2019

(54) TOUCHSCREEN

(71) Applicant: Japan Display Inc., Minato-ku (JP)

(72) Inventor: Jun Hanari, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 30 days.

(21) Appl. No.: 15/730,213

(22) Filed: Oct. 11, 2017

(65) Prior Publication Data

US 2018/0107316 A1 Apr. 19, 2018

(30) Foreign Application Priority Data

Oct. 14, 2016 (JP) ................................. 2016-202929

(51) Int. Cl.
*G06F 3/041* (2006.01)
*H01L 51/52* (2006.01)
*H01L 27/32* (2006.01)

(52) U.S. Cl.
CPC ........ *G06F 3/0412* (2013.01); *H01L 51/5203* (2013.01); *H01L 27/323* (2013.01); *H01L 27/3276* (2013.01)

(58) Field of Classification Search
CPC ... G06F 3/0412; G06F 3/041; H01L 51/5203; H01L 27/3225; H01L 27/323
See application file for complete search history.

(56) References Cited

U.S. PATENT DOCUMENTS

| | | | | |
|---|---|---|---|---|
| 8,367,440 | B2* | 2/2013 | Takayama | H01L 21/76251 438/30 |
| 9,483,135 | B2* | 11/2016 | Jeon | G06F 3/0412 |
| 2014/0183478 | A1* | 7/2014 | Lee | H01L 51/56 257/40 |
| 2015/0144920 | A1* | 5/2015 | Yamazaki | H01L 27/323 257/40 |
| 2015/0243892 | A1* | 8/2015 | Ogita | H01L 51/006 257/40 |
| 2015/0261333 | A1* | 9/2015 | Kaneyasu | G06F 3/041 345/173 |

(Continued)

FOREIGN PATENT DOCUMENTS

JP 2015-72663 4/2015

*Primary Examiner* — Benyam Ketema
(74) *Attorney, Agent, or Firm* — Oblon, McClelland, Maier & Neustadt, L.L.P.

(57) ABSTRACT

A touchscreen includes an OLED, upper-layer inorganic films on the OLED, a lower-layer inorganic film stacked between the OLED and a substrate, and a touch sensor on the upper-layer inorganic film. The upper-layer inorganic films and the lower-layer inorganic film extend over a display area and a picture-frame area. A lower-layer wiring is formed of a conductive film stacked between the OLED and the substrate. A sensor wiring is formed of a conductive film on the upper-layer inorganic film. An inorganic film joining portion where the upper-layer inorganic films and the lower-layer inorganic film are directly joined together or joined together with another inorganic material interposed therebetween is provided in the picture-frame area. A contact portion that electrically connects the sensor wiring with the lower-layer wiring is provided, in a plan view, in the inorganic film joining portion or an area on the outside thereof.

4 Claims, 10 Drawing Sheets

(56) References Cited

U.S. PATENT DOCUMENTS

| | | | |
|---|---|---|---|
| 2015/0317015 A1* | 11/2015 | Eguchi | G06F 3/044 345/174 |
| 2015/0318339 A1* | 11/2015 | Nakamura | H01L 27/3262 257/98 |
| 2015/0349041 A1* | 12/2015 | Miyake | H01L 27/3265 257/40 |
| 2016/0109998 A1* | 4/2016 | Watanabe | G06F 3/0412 349/12 |
| 2016/0282990 A1* | 9/2016 | Kimura | G02F 1/13338 |

\* cited by examiner

TOUCHSCREEN

CROSS-REFERENCE TO RELATED APPLICATION

The present application claims priority from Japanese application JP2016-202929 filed on Oct. 14, 2016, the content of which is hereby incorporated by reference into this application.

BACKGROUND OF THE INVENTION

1. Field of the Invention

The present invention relates to a touchscreen.

2. Description of the Related Art

A liquid crystal display (LCD) or an organic electroluminescent display device has been known as a display device.

The organic electroluminescent display device includes a structure in which, for example, pixel circuits, organic light-emitting diodes (OLEDs), a sealing film, and the like are stacked on a substrate made of glass or a resin film. A display surface protective film is bonded on the sealing film with, for example, an adhesive or the like.

Figure 10:
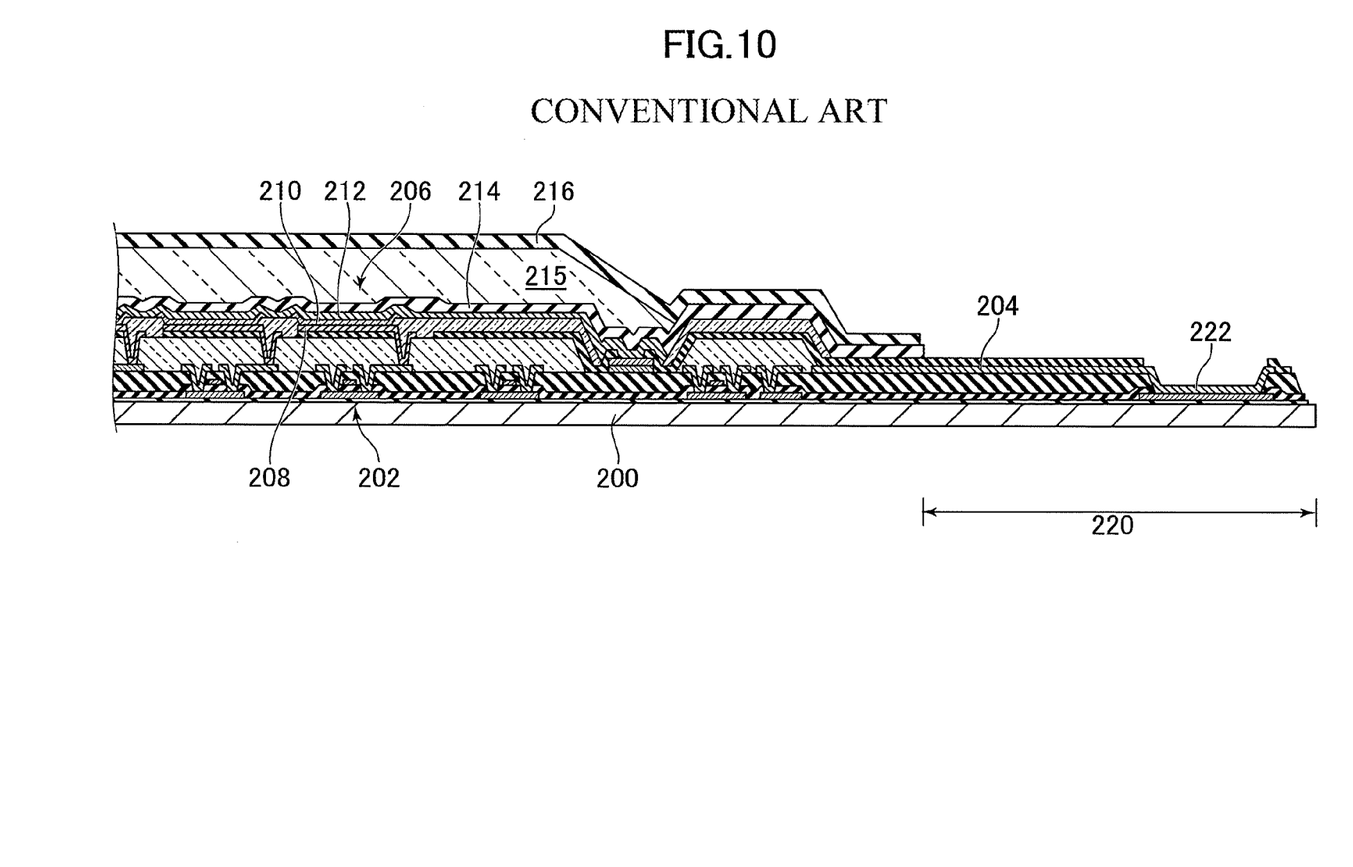
FIG. 10 is a schematic partial sectional view of a conventional organic electroluminescent display device.

FIG. 10 is a schematic partial sectional view of a conventional organic electroluminescent display device. Structures such as thin film transistors (TFTs) 202 constituting pixel circuits and wirings 204 are formed on a substrate 200. On the structures, OLEDs 206 are formed.

The OLED 206 is configured to include a lower electrode 208, an organic material layer 210, and an upper electrode 212. The organic material layer 210 includes a light-emitting layer. The lower electrode 208 and the upper electrode 212 interpose the organic material layer 210 therebetween. The lower electrode 208 constitutes an anode electrode (anode) of the OLED 206. The upper electrode 212 constitutes a cathode electrode (cathode) of the OLED 206. The upper electrode 212 is formed in common to pixels in the entire display area, and a common voltage is applied from a drive portion to the upper electrode 212. On the other hand, the lower electrode 208 is formed for each of the pixels.

A sealing film is stacked on the surface of the OLED 206. The sealing film can have a multilayer structure composed of two layers of inorganic films 214 and 216 and an organic film 215 interposed therebetween.

The organic electroluminescent display device includes a connection terminal area 220 adjacent to the display area. In the connection terminal area 220, the wirings 204 extracted from the display area and connection terminals 222 for connecting the wirings to an external circuit are disposed. A flexible printed circuit (FPC) is connected to the connection terminals 222. The organic electroluminescent display device operates with electric signals supplied from the external circuit via the FPC.

As one of forms of the display device, a touchscreen including a display panel and a touch sensor combined together is present. Examples of the touchscreen include an on-cell type touchscreen having a structure in which the touch sensor and the display panel are bonded together, and an in-cell type touchscreen in which the structure of the touch sensor is built into the display panel.

In the on-cell type touchscreen, wirings for external connection are prepared separately for the touch sensor and the display panel. Therefore, an FPC connected to the touch sensor and an FPC connected to the display panel are basically different. In this regard, in an in-cell type LCD, by connecting a wiring layer of the touch sensor and a wiring layer of the LCD with a contact structure using a through hole, wirings for external connection of the touch sensor and wirings for external connection of the LCD can be formed of one wiring layer, or the wirings for external connection can be shared, and thus connection with the external circuit can be made using one FPC.

SUMMARY OF THE INVENTION

Since the upper electrode of the OLED extends over the entire display area, it is difficult to provide a contact structure that connects a wiring layer located above the OLED, that is, located above the upper electrode, with a wiring layer located below the upper electrode. In this regard, the organic electroluminescent display device is different from the LCD. Therefore, a touchscreen using the organic electroluminescent display device is generally configured as that of the on-cell type, which inhibits the reduction of components.

The invention makes it easy to configure an in-cell type touchscreen including an organic electroluminescent display device.

A touchscreen according to an aspect of the invention includes: a substrate; a plurality of light-emitting elements disposed on the substrate and including an organic material layer, a lower electrode, and an upper electrode, the organic material layer including a light-emitting layer, the lower electrode and the upper electrode interposing the organic material layer therebetween; an upper-layer inorganic film disposed, in a plan view, to extend over a display area where the plurality of light-emitting elements are arranged and an outer edge area located outside the display area, the upper-layer inorganic film being located on the light-emitting element; a lower-layer inorganic film disposed to extend over the display area and the outer edge area and located between the light-emitting element and the substrate; a lower-layer wiring located between the lower-layer inorganic film and the substrate; a touch sensor disposed on the upper-layer inorganic film; a sensor wiring disposed on the upper-layer inorganic film and connected to the touch sensor; an inorganic film joining portion where the upper-layer inorganic film and the lower-layer inorganic film are directly joined together or joined together with another inorganic film interposed therebetween, the inorganic film joining portion being located in the outer edge area; and a contact portion located, in a plan view, in the inorganic film joining portion or on a side of the inorganic film joining portion opposite to the display area, the contact portion electrically connecting the sensor wiring with the lower-layer wiring.

DETAILED DESCRIPTION OF THE INVENTION

Hereinafter, an embodiment of the invention (hereinafter referred to as "embodiment") will be described with reference to the drawings. However, the invention can be implemented in various aspects within the scope not departing from the gist thereof, and should not be interpreted as being limited to the details described in the embodiment illustrated below.

In the drawings, the width, thickness, shape, and the like of each part may be schematically represented, compared to those in practicing aspects of the invention, for more clarity of description. However, they are illustrative only and do not limit the interpretation of the invention. In the specification and the drawings, elements having functions similar to those described in relation to a previous drawing are denoted by the same reference numerals and signs, and a redundant description may be omitted.

Further, in the detailed description of the invention, the terms "on" and "below" as used in defining the positional relationship between one component and another component include, not only the case where one component is located directly on or directly below another component, but also the case where still another component intervenes between the components unless otherwise noted.

A device according to the embodiment is a touchscreen 2 in which the structure of a touch sensor is formed on the surface of a display panel. The display panel is an organic electroluminescent display device. In a display area of the display panel, a pixel array portion in which pixels each including an OLED as a self-emitting element are two-dimensionally arranged is provided, and an image is displayed. On the other hand, the touch sensor stacked on the display surface side of the display area detects the approach or contact, or the position thereof, of a user's finger or the like to the display surface.

Figure 1:
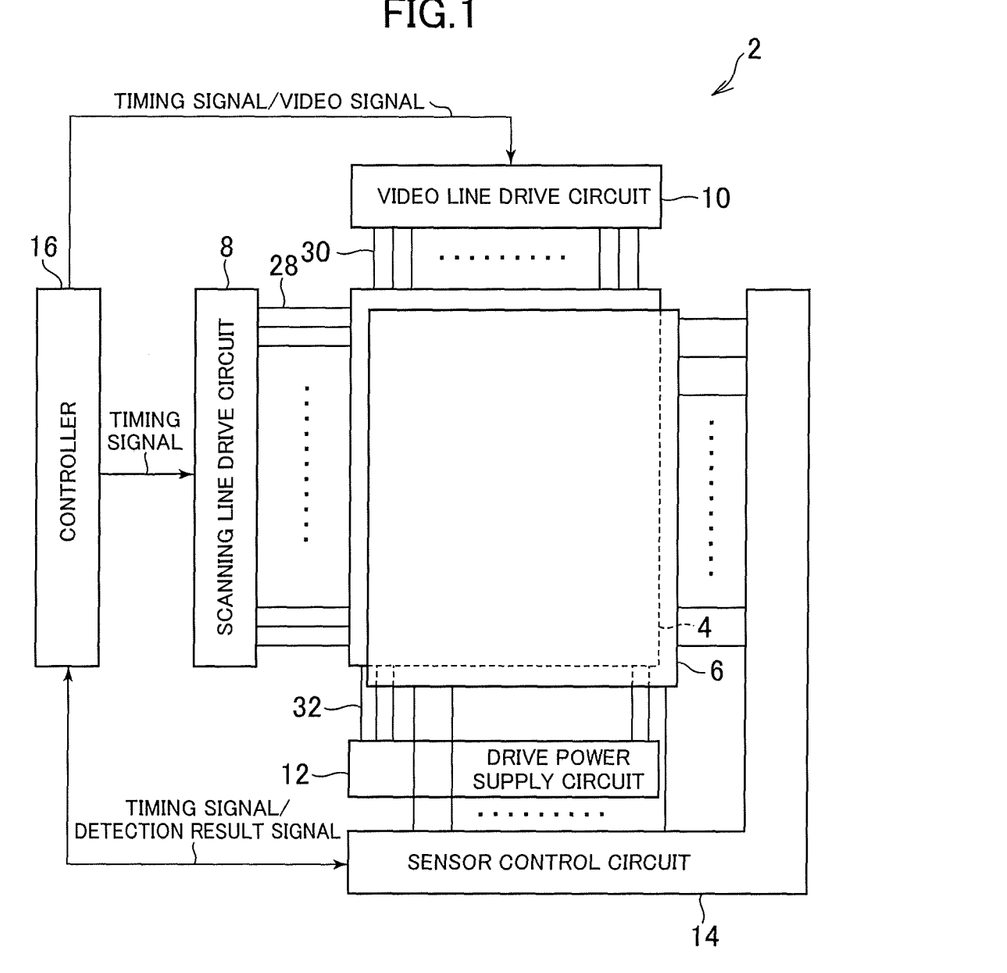
FIG. 1 is a schematic diagram showing a schematic configuration of a touchscreen according to an embodiment of the invention.

FIG. 1 is a schematic diagram showing a schematic configuration of the touchscreen according to the embodiment. The touchscreen 2 includes the pixel array portion 4, the touch sensor 6, a scanning line drive circuit 8, a video line drive circuit 10, a drive power supply circuit 12, a sensor control circuit 14, and a controller 16.

Figure 2:
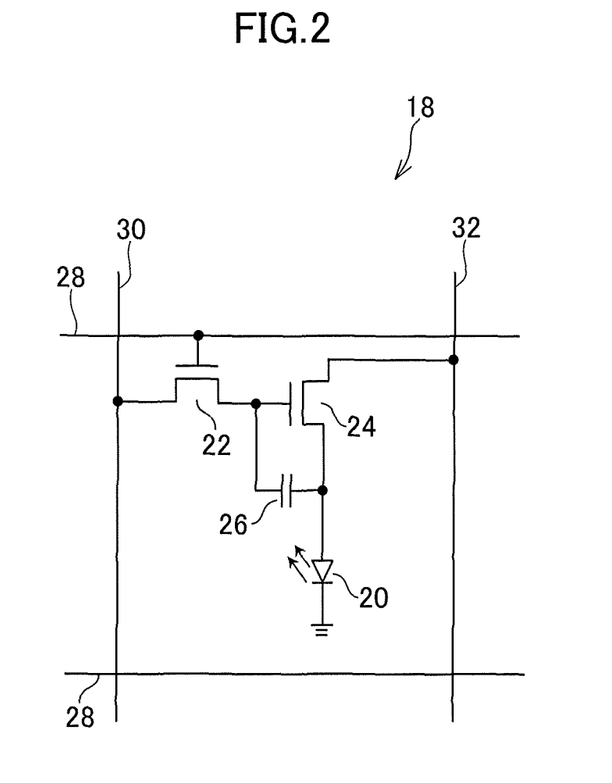
FIG. 2 is a schematic circuit diagram of an exemplary pixel circuit formed for each of pixels of a pixel array portion.

FIG. 2 is a schematic circuit diagram of an exemplary pixel circuit formed for each of the pixels of the pixel array portion 4. In the example shown in FIG. 2, the pixel circuit 18 includes an OLED 20, a pixel TFT 22, a drive TFT 24, and a storage capacitor 26.

A gate of the pixel TFT 22 is electrically connected to a scanning signal line 28. The scanning signal line 28 is provided for each arrangement of pixels in the horizontal direction (pixel row), and is connected in common to gates of a plurality of pixel TFTs 22 arranged in the pixel row. One of a source and a drain of the pixel TFT 22 is electrically connected to a video signal line 30, while the other is electrically connected to a gate of the drive TFT 24. The video signal line 30 is provided for each arrangement of pixels in the vertical direction (pixel column), and is connected in common to a plurality of pixel TFTs 22 arranged in the pixel column. A channel conductivity type of the drive TFT 24 is, for example, an n-type. A source of the drive TFT 24 is electrically connected to an anode of the OLED 20, and a drain of the drive TFT 24 is electrically connected to a power line 32. A cathode of the OLED 20 is composed of an electrode common to all of the pixels, and is fixed at a ground potential or a negative potential. The power line 32 is supplied with a potential that generates a positive voltage between a cathode potential of the OLED and the power line 32.

The scanning line drive circuit 8, the video line drive circuit 10, the drive power supply circuit 12, and the controller 16 drive the pixel circuit 18 to control light emission of the OLED 20.

The scanning line drive circuit 8 is connected to the scanning signal line 28 provided for each pixel row. The scanning line drive circuit 8 sequentially selects the scanning signal line 28 in response to a timing signal input from the controller 16, and applies a voltage to turn on the pixel TFT 22 to the scanning signal line 28 selected.

The video line drive circuit 10 is connected to the video signal line 30 provided for each pixel column. The video line drive circuit 10 receives a video signal from the controller 16, and outputs, in synchronization with the selection of the scanning signal line 28 by the scanning line drive circuit 8, a voltage in response to the video signal of the selected pixel row to each of the video signal lines 30. The voltage is written to the storage capacitor 26 via the pixel TFT 22 in the selected pixel row. A gate-source potential $V_{GS}$ of the drive TFT 24 is held at the voltage written to the storage capacitor 26, and the drive TFT 24 supplies a current in response to the $V_{GS}$ to the OLED 20. With this configuration, the OLED 20 of the pixel corresponding to the scanning signal line 28 selected emits light.

The drive power supply circuit 12 is connected to the power line 32 provided for each pixel column, and supplies a current to the OLED 20 via the power line 32 and the drive TFT 24 in the selected pixel row.

Figure 3:
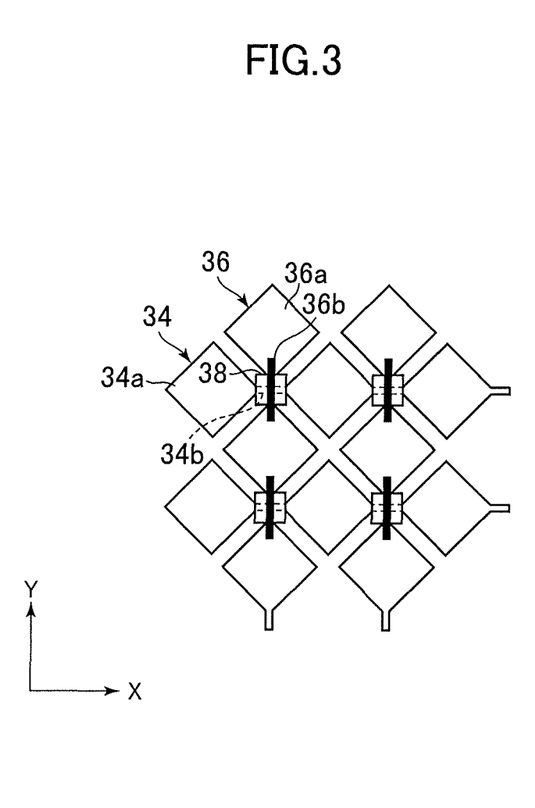
FIG. 3 is a schematic partial plan view of a touch sensor.

FIG. 3 is a schematic plan view of the touch sensor 6. The touch sensor 6 is disposed basically in the entire display area, and FIG. 3 is a partial plan view showing a partial area of the display area. The touch sensor 6 shown as one example in FIG. 3 is a projected capacitive touch sensor. In FIG. 3, the horizontal direction is the X-axis, while the vertical direction is the Y-axis.

The touch sensor 6 includes sensor electrodes 34 and 36 formed on a surface composed of an insulating layer of the display area. The electrode 34 extends along the X-axis direction, and a plurality of the electrodes 34 are arranged spaced apart from one another in the Y-axis direction. The electrode 36 extends along the Y-axis direction, and a plurality of the electrodes 36 are arranged spaced apart from one another in the X-axis direction.

The electrode 34 includes a plurality of pad electrode portions 34a arranged in the X-axis direction, and bridge wiring portions 34b each connecting the pad electrode portions 34a adjacent to each other. On the other hand, the electrode 36 includes a plurality of pad electrode portions 36a arranged in the Y-axis direction, and bridge wiring portions 36b each connecting the pad electrode portions 36a adjacent to each other. The pad electrode portions 34a and 36a are formed substantially in a diamond shape in a plan view, and disposed such that the two diagonals of the diamond shape are along the X-axis and the Y-axis. The pad electrode portion 34a and the pad electrode portion 36a are alternately disposed (disposed in a checked pattern) in the X-axis direction and the Y-axis direction. The pad electrode portions 34a and 36a and the bridge wiring portion 34b are formed of the same transparent conductive film. The bridge wiring portion 36b is formed of a conductive material in a layer different from the conductive film, and crosses over the bridge wiring portion 34b to connect the pad electrode portions 36a. The bridge wiring portion 36b and the bridge wiring portion 34b are electrically insulated from each other by an insulating film 38. One of the electrodes 34 and 36 constitutes a drive electrode (transmitting electrode) of the touch sensor, while the other constitutes a detection electrode (receiving electrode).

Figure 4:
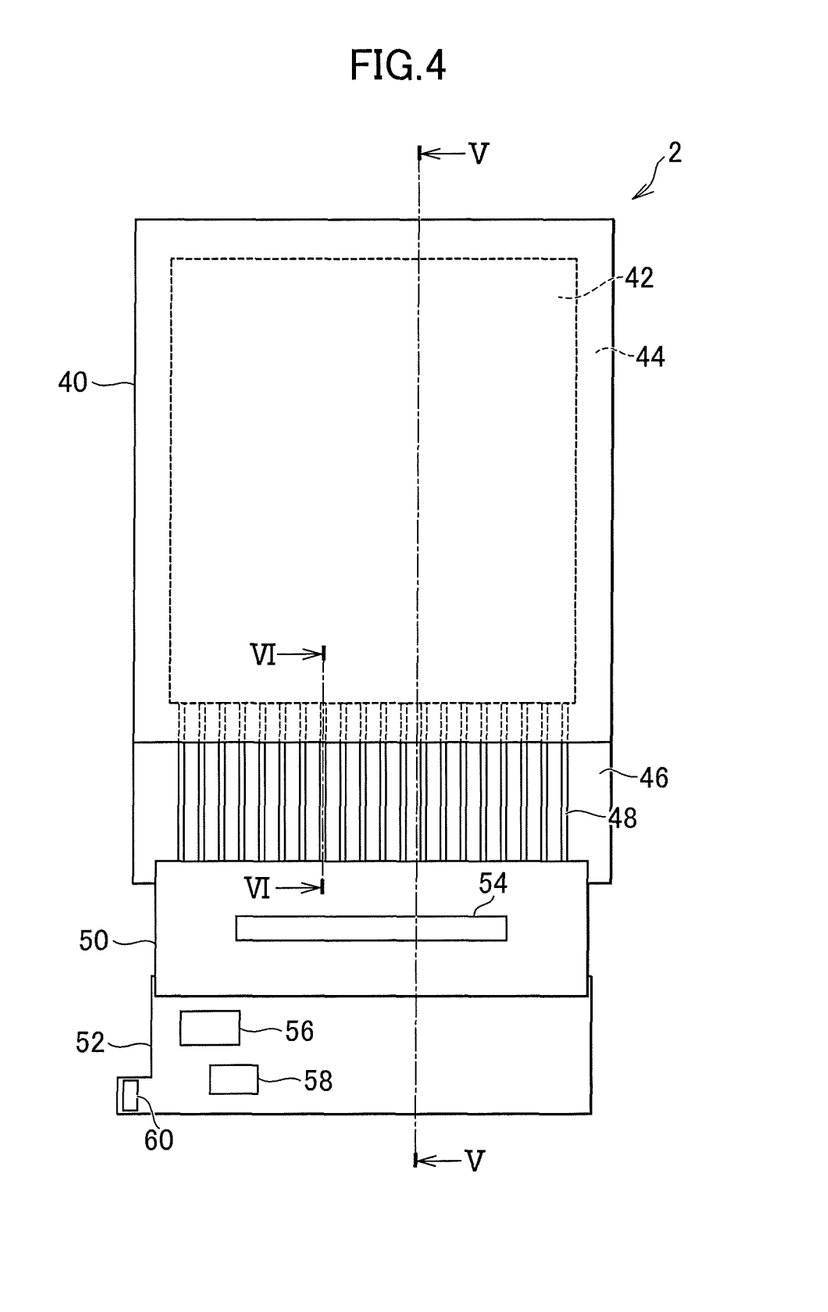
FIG. 4 is a schematic plan view of the touchscreen according to the embodiment of the invention.

FIG. 4 is a schematic plan view of the touchscreen 2. A main substrate 40 has a rectangular shape, and includes the display area 42, a picture-frame area 44, and a connection terminal area 46. The pixel array portion 4 shown in FIG. 1 is provided in the display area 42, and the OLEDs are arranged in the pixel array portion 4 as described above. Also, the touch sensor 6 shown in FIG. 1 is provided in the display area 42, and the electrodes 34 and 36 shown in FIG. 3 are arranged.

The picture-frame area 44 is an outer edge area located outside the display area 42. The inside boundary of the picture-frame area 44 coincides with the outline of the display area 42, and the outside boundary has a rectangular shape. Three sides of the rectangular shape are the sides of the main substrate 40, and the remaining one side is a boundary between the connection terminal area 46 and the picture-frame area 44.

The connection terminal area 46 is provided adjacent to the picture-frame area 44. The connection terminal area 46 has a rectangular shape whose three sides are the sides of the main substrate 40 and whose remaining one side is a boundary between the picture-frame area 44 and the connection terminal area 46. Wirings for inputting and outputting electric signals necessary for the operation of the pixel array portion 4 and the touch sensor 6 are extracted from the display area 42 and the picture-frame area 44 to the connection terminal area 46. That is, a group of wirings 48 extracted from the display area 42 and the picture-frame area 44 is disposed in the connection terminal area 46. Moreover, connection terminals for connecting the wiring group to an external circuit are disposed in the connection terminal area 46.

In the embodiment, an attached substrate 52 is connected to the main substrate 40 via an FPC 50 (a flexible printed circuit). The FPC 50 has, for example, a rectangular shape. An edge portion of the FPC 50 that is along one side thereof overlaps an area where the connection terminals are disposed in the connection terminal area 46, and wirings formed in the FPC 50 are electrically connected to the connection terminals of the connection terminal area 46. Moreover, an edge portion of the FPC 50 that is along a side thereof opposed to, for example, the edge connected to the connection terminal area 46 overlaps the edge of the attached substrate 52, and the wirings of the FPC 50 and the wirings of the attached substrate 52, which face each other in the overlapped portion, are electrically connected.

For example, a driver integrated circuit (IC) 54 of the pixel array portion 4 and the like may be mounted on the surface of the FPC 50. An electronic circuit including an IC 56 forming the sensor control circuit 14, and other circuit components 58, may be formed, or a connector 60 for external connection may be provided, on the attached substrate 52.

Figure 5A:
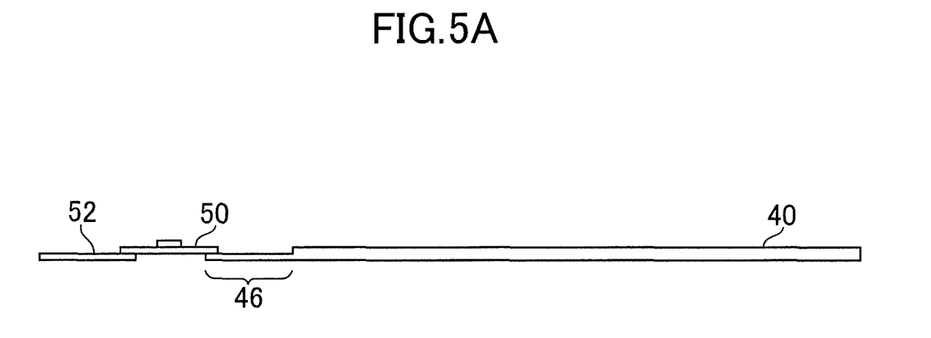
FIG. 5A is a schematic vertical sectional view of the touchscreen at a position along line V-V shown in FIG. 4.
Figure 5B:
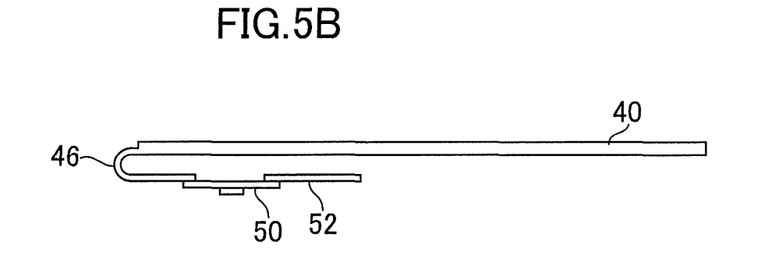
FIG. 5B is a schematic vertical sectional view of the touchscreen at a position along line V-V shown in FIG. 4, in the state where a connection terminal area, an FPC, and an attached substrate are folded back to the rear surface side of a main substrate.

FIGS. 5A and 5B are schematic vertical sectional views of the touchscreen 2 at a position along line V-V shown in FIG. 4. FIG. 5A is a sectional view in the state where the main substrate 40, the FPC 50, and the attached substrate 52 are located on the same plane as shown in FIG. 4. Here, the FPC 50 and the attached substrate 52 can be folded back to the rear surface side of the main substrate 40 by bending the FPC 50. With this configuration, the size of the touchscreen 2 in a plan view can be reduced, and the downsizing of an electronic apparatus on which the touchscreen 2 is mounted can be achieved. Further, also the main substrate 40 can be formed using a flexible insulating substrate of polyimide or the like. In this case, also the connection terminal area 46 can be folded back to the rear surface side of the main substrate 40, and the downsizing of the electronic apparatus can be further achieved. FIG. 5B is a sectional view in the state where the connection terminal area 46 of the main substrate 40, the FPC 50, and the attached substrate 52 are folded back to the rear surface side of the main substrate 40.

Since the FPC 50, the attached substrate 52, and further the connection terminal area 46 of the main substrate 40 are hidden at the rear surface, the ratio of the display area 42 occupying the front of the electronic apparatus can be increased. Moreover, the area of the picture-frame area 44 can be reduced by not using the picture-frame area 44 as an arrangement area for the driver IC 54 and the like. That is, a so-called narrower picture-frame in a display device can be progressed.

Figure 6:
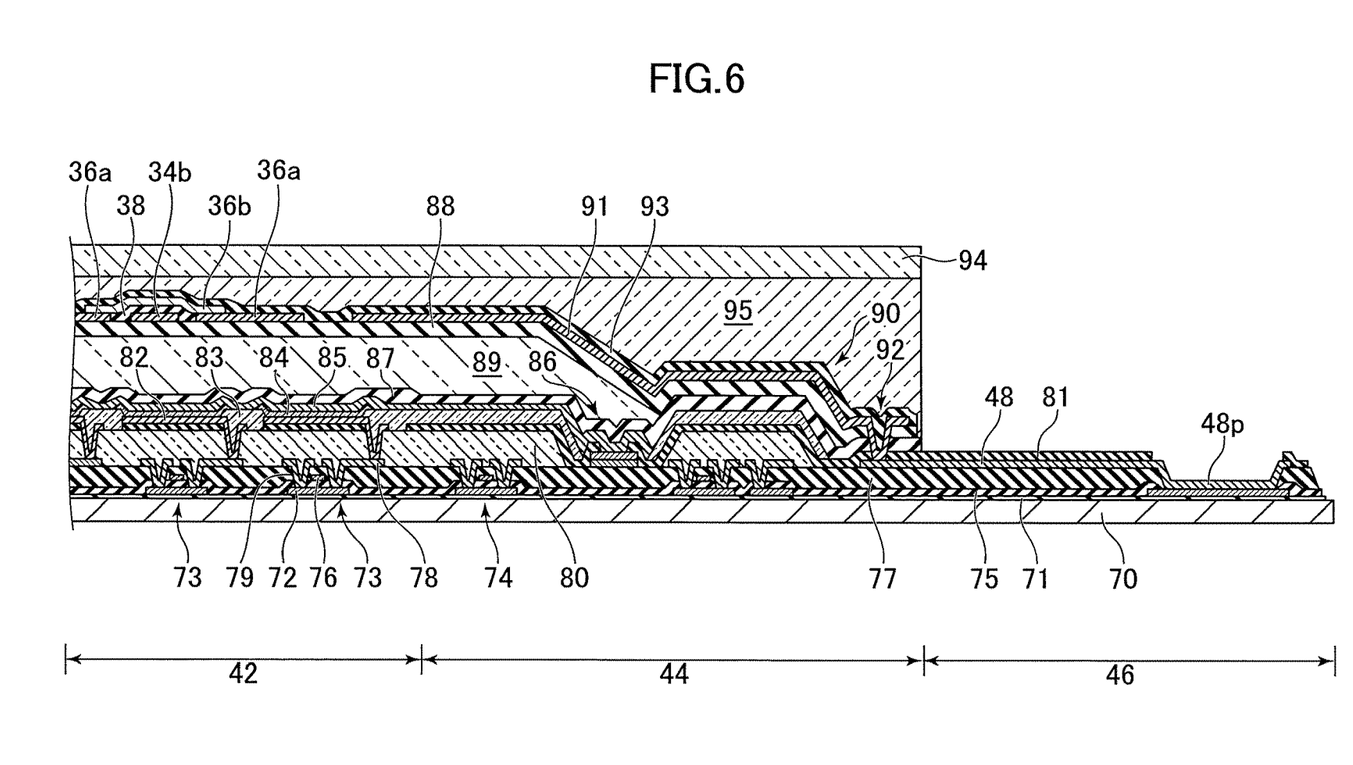
FIG. 6 is a schematic vertical sectional view of the touchscreen at a position along line VI-VI shown in FIG. 4.

FIG. 6 is a schematic vertical sectional view of the touchscreen 2 at a position along line VI-VI shown in FIG. 4. A substrate 70 is composed of a film having flexibility, such as of polyimide or polyethylene terephthalate. For example, the thickness of the substrate 70 can be 10 to 20 μm. The substrate 70 can also be formed of other resins or glass. An undercoat layer 71 serving as a barrier to impurities contained in the substrate 70 is formed on the surface of the substrate 70. The undercoat layer 71 is composed of a silicon oxide film, a silicon nitride film, or the like, and may be a stacked structure of these films.

A semiconductor layer 72 is stacked on the undercoat layer 71. A channel region, a source region, and a drain region of a TFT 73 of a pixel circuit, or of a TFT 74 of a peripheral circuit, are formed of the semiconductor layer 72. The TFT 73 shown in FIG. 6 is the drive TFT 24 in FIG. 2. After the formation of the semiconductor layer 72, a gate insulating film 75 is formed of silicon oxide or the like, and a metal film stacked on the gate insulating film 75 is patterned to form a gate electrode 76 of the TFT and the like.

An inorganic film 77 is stacked as an interlayer insulating film to cover the gate electrode 76 and the like. A metal film is formed on the inorganic film 77, and a source electrode 78 and a drain electrode 79 of the TFT are formed using the metal film. The metal film is a conductive film stacked between the OLED and the substrate 70, and a lower-layer wiring located below the OLED can be formed using the metal film. Specifically, the wiring 48 (a first wiring) of the connection terminal area 46 and a connection terminal 48p of the wiring 48 are formed of the lower-layer wiring. The source electrode 78 and the drain electrode 79 are electrically connected to the semiconductor layer 72 of the TFT via a contact hole penetrating the gate insulating film 75 and the inorganic film 77.

A planarization film 80 made of an organic material is stacked to cover the inorganic film 77. Polyimide, acrylic resin, or the like is used as the planarization film 80. The planarization film 80 planarizes a surface on which the OLED is formed.

On the other hand, an inorganic film 81 is formed on the surface of the planarization film 80 for preventing the entry of moisture from the planarization film 80 and the like into the OLED. That is, the inorganic film 81 is an inorganic film that is disposed below the OLED and seals the lower surface of the OLED to prevent the degradation of the OLED due to moisture. Hereinafter, the inorganic film is referred to as "lower-layer inorganic film". The lower-layer inorganic film 81 (a first insulating film) is formed of a material having moisture-proofness and insulating properties. Lower electrodes 82 of the OLEDs are disposed on the surface of the lower-layer inorganic film 81. The lower-layer inorganic film 81 covers the surface of the wiring 48 in the connection terminal area 46. For example, the lower-layer inorganic film 81 is formed using a silicon nitride film, or a stacked film of a silicon nitride film and a silicon oxide film.

The lower electrodes 82 each correspond to the anode of the OLED 20 in FIG. 2, and are a plurality of pixel electrodes configured so as to respectively correspond to a plurality of unit pixels (sub-pixels). The lower electrode 82 is electrically connected to the source electrode 78 of the TFT 73 corresponding to the drive TFT 24 via a contact hole penetrating the lower-layer inorganic film 81 and the planarization film 80. The lower electrode 82 can have a structure including a reflection film that reflects light emitted by the OLED 20 to the display surface side. For example, the lower electrode 82 can have a stacked structure of a transparent conductive material such as indium tin oxide (ITO) or indium zinc oxide (IZO) and a reflection material such as silver (Ag).

A bank 83 made of an insulating material is formed on the surface of the lower-layer inorganic film 81 on which the lower electrode 82 is formed. The bank 83 is formed along the boundary of the pixel and forms an opening at the position of the light-emitting surface of the OLED. An organic material layer 84 including a light-emitting layer is formed at the bottom portion of the opening. The bank 83 is formed of polyimide, acrylic resin, or the like.

An upper electrode 85 of the OLED is formed on the organic material layer 84. The upper electrode 85 corresponds to the cathode of the OLED 20 in FIG. 2. As previously described, the upper electrode 85 can be the common electrode extending over the pixels in the entire display area. The upper electrode 85 is formed of a material that transmits light emitted from the organic material layer 84. For example, the upper electrode 85 is formed of a transparent conductive material such as ITO or IZO. The upper electrode 85 is electrically connected to the lower-layer wiring via a contact hole 86 provided in the picture-frame area 44.

In the display area 42 where the OLED composed of the lower electrode 82, the organic material layer 84, and the upper electrode 85 is formed, a sealing film that seals the upper surface of the OLED to prevent the degradation of the OLED due to moisture is formed. In the embodiment, the sealing film is a multilayer film composed of two inorganic films 87 and 88 and an organic film 89. The inorganic films 87 and 88 are formed of, for example, silicon nitride films, and the organic film 89 is formed of resin. Here, the inorganic films 87 and 88 are inorganic films that are disposed on the OLED and have the function of sealing the upper surface of the OLED. Hereinafter, the inorganic films 87 and 88 are each referred to as "upper-layer inorganic film". The first upper-layer inorganic film 87 is stacked on the surface of the upper electrode 85 in the display area 42. The organic film 89 is interposed between the first upper-layer inorganic film 87 (a second insulating film) and the second upper-layer inorganic film 88 (a third insulating film) in the display area 42. The upper-layer inorganic films 87 and 88 include a contact area where the upper-layer inorganic films 87 and 88 overlap and are in direct contact with each other in the picture-frame area 44.

Here, an inorganic film joining portion 90 where the upper-layer inorganic films 87 and 88 and the lower-layer inorganic film 81 are joined together is provided in the picture-frame area 44. By providing the inorganic film joining portion 90, the entry of moisture from the side into an area that is interposed between the upper-layer inorganic films 87 and 88 and the lower-layer inorganic film 81 is prevented, and thus the prevention of degradation of the OLED is achieved. From this point of view, the inorganic film joining portion may have a structure in which the upper-layer inorganic films and the lower-layer inorganic film are directly joined together, or may have a structure in which the upper-layer inorganic films and the lower-layer inorganic film are joined together with another inorganic material interposed therebetween. The inorganic film joining portion 90 of the embodiment has a structure in which the three layers of inorganic films composed of the upper-layer inorganic films 87 and 88 and the lower-layer inorganic film 81 are directly joined together. The inorganic film joining portion is basically provided continuously around the display area 42, and thus, the entry of moisture can be more effectively prevented.

The touch sensor 6 is formed on the upper-layer inorganic film. A sensor wiring 91 (a second wiring) connected to the touch sensor 6 is formed of a conductive film stacked on the upper-layer inorganic film. In the embodiment, the touch sensor 6 and the sensor wiring 91 are formed on the upper-layer inorganic film 88, which is an upper-side one of the upper-layer inorganic films provided in the two layers. Another layer may be present between the upper-layer inorganic film 88 and the electrodes of the touch sensor 6 and between the upper-layer inorganic film 88 and the sensor wiring 91. In the embodiment, however, the transparent conductive film made of ITO, IZO, or the like stacked on the surface of the upper-layer inorganic film 88 is patterned to form the pad electrode portions 34*a* and 36*a* and the bridge wiring portion 34*b* of the touch sensor 6, and a metal film or transparent conductive film stacked on the surface of the upper-layer inorganic film 88 is patterned to form the sensor wiring 91. The insulating film 38 is formed on the bridge wiring portion 34*b*, and the bridge wiring portion 36*b* is formed on the insulating film 38.

The sensor wiring 91 is electrically connected to the wiring 48, which is the lower-layer wiring. A contact hole 92 is formed in the inorganic film joining portion 90 provided in the picture-frame area 44. A contact portion that electrically connects the sensor wiring 91 with the wiring 48 is formed using the contact hole 92. The sensor wiring 91 is provided corresponding to each of the plurality of sensor electrodes 34 and 36. One end of each of the sensor wirings 91 is connected to the sensor electrode, and the contact portion is provided at the other end. The contact portion can be disposed basically at a portion that is adjacent to the connection terminal area 46, in the picture-frame area 44 provided around the display area 42.

The display area 42 and the picture-frame area 44 where the touch sensor 6 and the sensor wiring 91 are formed are covered with an inorganic film 93. Further, a display surface protective film 94 is attached on the inorganic film 93 with an adhesive 95.

Although only the wiring connected to the sensor wiring 91 is shown as the wiring 48 of the connection terminal area 46 in FIG. 6, the wirings for inputting and outputting the electric signals necessary for the operation of the pixel array portion 4 and the touch sensor 6 are basically connected to the wirings 48 of the connection terminal area 46 as described above. That is, both a display terminal (a first terminal) connecting to a display wiring used for driving the OLED and a sensor terminal (a second terminal) connecting to the sensor wiring 91 via the contact portion are disposed as the connection terminals 48p in the connection terminal area 46. The connection terminals 48p are localized in the connection terminal area 46, which is along one side of the picture-frame area 44 having a rectangular shape, and the heights of the connection terminals 48p can be basically made uniform. Therefore, an FPC connected to the display terminal and an FPC connected to the sensor terminal are integrally configured, and this integrally configured FPC can be connected to the connection terminal area 46. That is, the touchscreen 2 can have a structure including the FPC 50 connected in common to the display terminal and the sensor terminal, and the number of FPCs connected to the connection terminal area 46 can be one as shown in FIG. 4. With this configuration, the number of FPCs is reduced, and a reduction in components constituting the touchscreen 2 is achieved.

Figure 7:
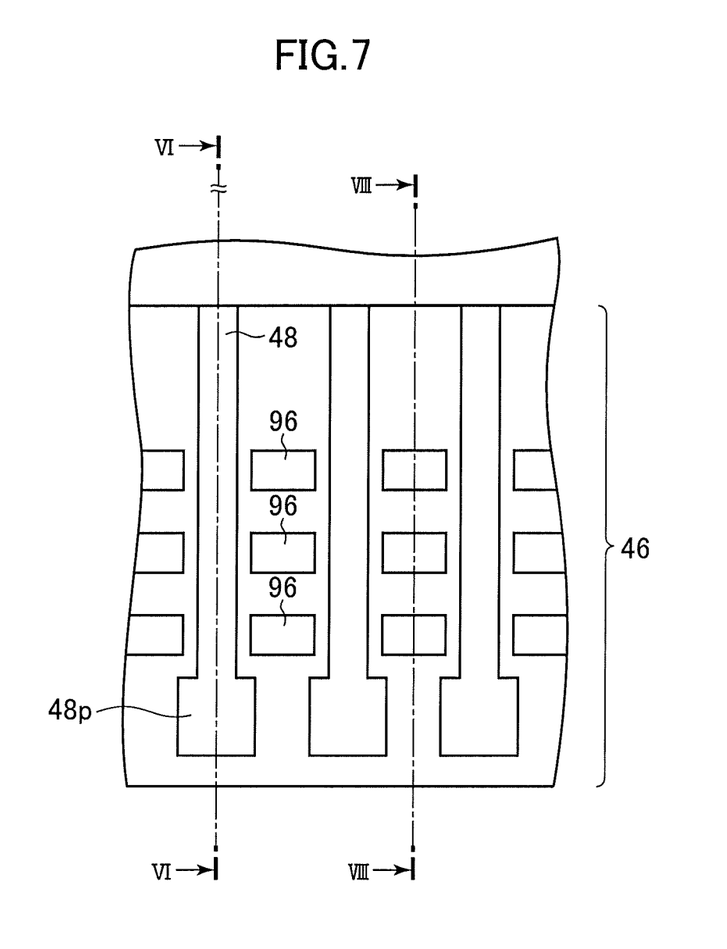
FIG. 7 is an enlarged schematic plan view of a portion of the connection terminal area.
Figure 8:
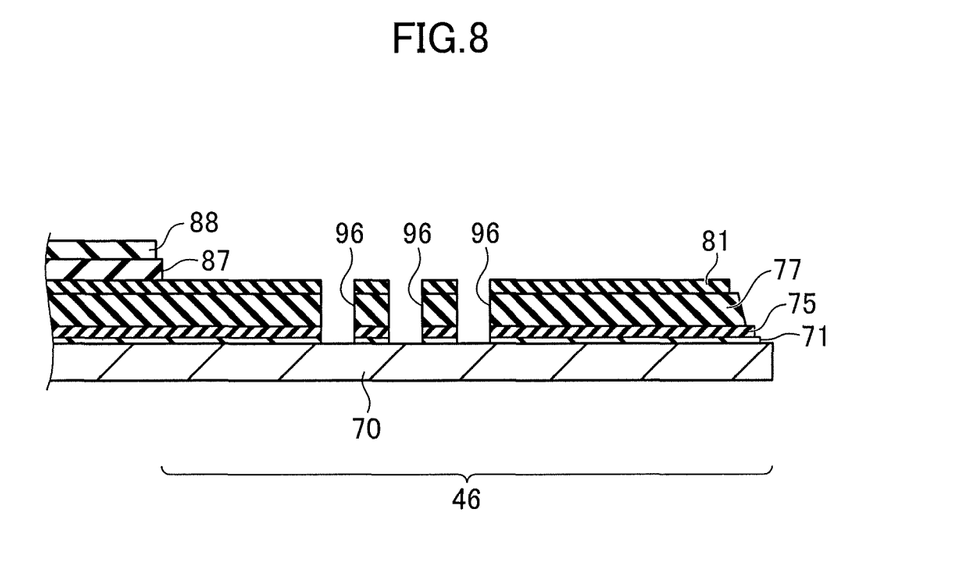
FIG. 8 is a schematic vertical sectional view of the connection terminal area along line VIII-VIII of FIG. 7.

FIG. 7 is an enlarged schematic plan view of a portion of the connection terminal area 46. The vertical section of the connection terminal area 46, shown in FIG. 6, is a cross-section along line VI-VI of FIG. 7. On the other hand, FIG. 8 is a schematic vertical sectional view of the connection terminal area 46 along line VIII-VIII of FIG. 7. Recessed portions 96 can be formed in the surface of an area between the wirings 48 adjacent to each other in the connection terminal area 46, and thus, the main substrate 40 can be easily bent in the connection terminal area 46 as shown in FIG. 5B. The recessed portion 96 is formed by removing the stacked structure (e.g., stacked layers composed of the undercoat layer 71, the gate insulating film 75, the inorganic film 77, and the lower-layer inorganic film 81) on the substrate 70 by etching or the like. The substrate 70 is basically thick compared to the stacked structure on the substrate 70 in the connection terminal area 46. Therefore, the flexibility of the connection terminal area 46 may be increased to make it easily bent by forming recessed portions in the rear surface of the substrate 70 in the connection terminal area 46, instead of the recessed portions 96 on the surface side of the substrate 70, or in addition to the recessed portions 96. FIG. 7 shows an example in which three recessed portions 96 whose planar shape is a rectangular shape are provided between the two wirings 48 adjacent to each other. However, the planar shape is not limited to a rectangular shape, and may be, for example, a circle, an ellipse, or the like. Moreover, the number of recessed portions is not limited to three.

The contact portion electrically connecting the sensor wiring with the lower-layer wiring can be provided in the inorganic film joining portion, or an area on the outside of the inorganic film joining portion, in the main substrate 40 of the touchscreen 2 in a planview. Since an area where the upper electrode 85 is provided is basically located on the inside of the inorganic film joining portion, the contact portion provided in the inorganic film joining portion or on the outside thereof can avoid interference with the upper electrode 85. Moreover, since the contact portion provided at the position does not cause a hole in communication with an area including the OLED 20 sealed by the lower-layer inorganic film 81 and the upper-layer inorganic films 87 and 88, the effect of not impairing the sealing function of the inorganic films is also provided.

Figure 9:
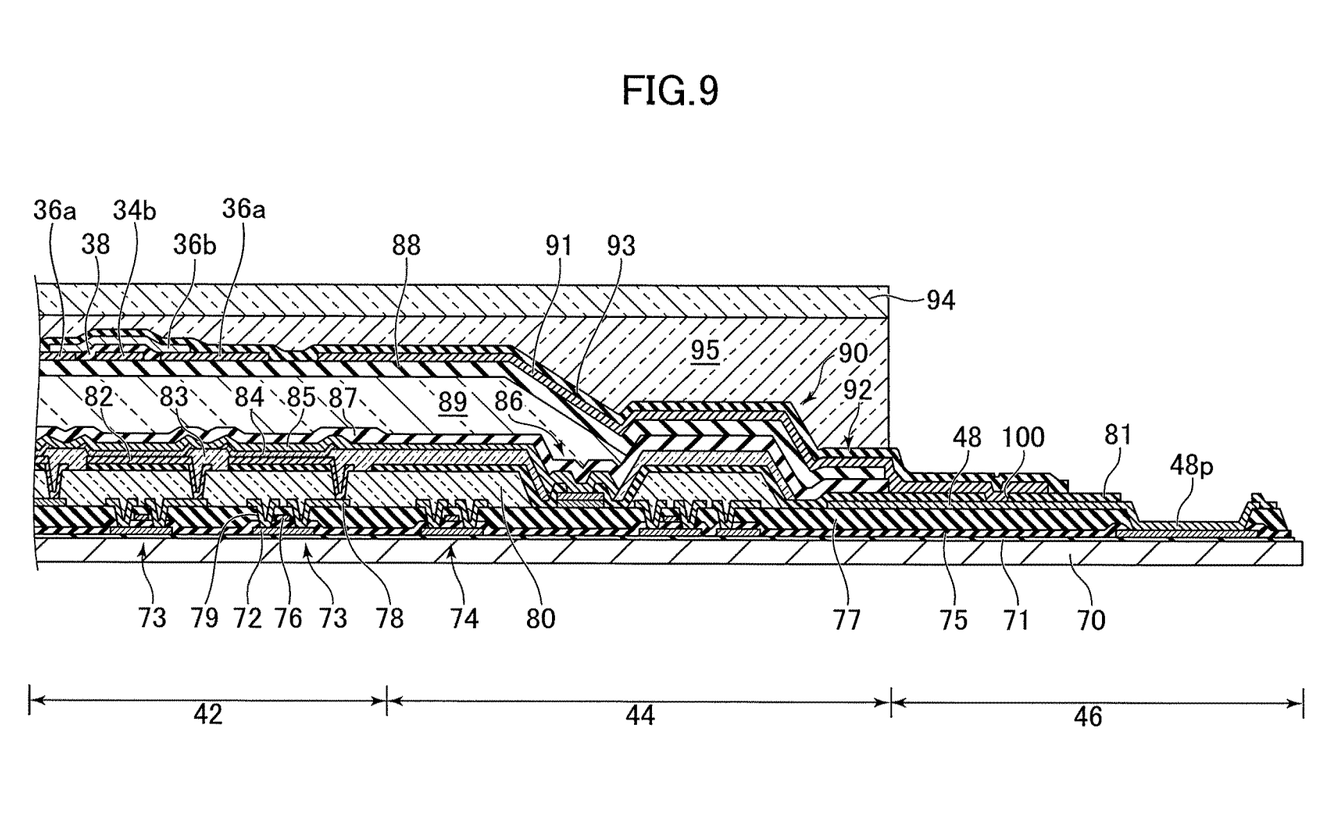
FIG. 9 is a schematic vertical sectional view of the touchscreen, showing another configuration example relating to the position of a contact portion.

With regard to the position of the contact portion, FIG. 6 shows the configuration in which the contact portion is provided in the inorganic film joining portion 90. FIG. 9 is a schematic vertical sectional view of the touchscreen 2 showing another configuration example relating to the position of the contact portion, and is a sectional view at a position along line VI-VI shown in FIG. 4, similarly to FIG. 6.

FIG. 9 shows an exemplary configuration in which the contact portion is provided in the area on the outside of the inorganic film joining portion 90. In this configuration, the sensor wiring 91 is extended to the outside of the inorganic film joining portion 90, specifically, to within the connection terminal area 46. That is, one end of the sensor wiring 91 is connected to the sensor electrode similarly to the configuration of FIG. 6, while the other end reaches the connection terminal area 46. A contact hole 100 penetrating the lower-layer inorganic film 81 and exposing the wiring 48 is formed at the position of the other end, and the contact portion electrically connecting the sensor wiring 91 with the wiring 48 is formed using the contact hole 100. Also in the configuration, flexibility can be increased by forming the recessed portions 96 described using FIGS. 7 and 8 in the connection terminal area 46.

The contact portion of the sensor wiring and the lower-layer wiring can be disposed in a portion of the picture-frame area 44 that is not adjacent to the connection terminal area 46.

The invention is not limited to the embodiment described above but can be variously modified. For example, the configuration described in the embodiment may be replaced with substantially the same configuration, a configuration providing the same operational effect, or a configuration capable of achieving the same object.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A touchscreen comprising:
   a substrate;
   a plurality of light-emitting elements disposed on the substrate and including an organic material layer, a lower electrode, and an upper electrode, the organic material layer including a light-emitting layer, the lower electrode and the upper electrode interposing the organic material layer therebetween;
   an upper-layer inorganic film disposed, in a plan view, to extend over a display area where the plurality of light-emitting elements are arranged and an outer edge area located outside the display area, the upper-layer inorganic film being located on the light-emitting element;
   a lower-layer inorganic film disposed to extend over the display area and the outer edge area and located between the light-emitting element and the substrate;
   a lower-layer wiring located between the lower-layer inorganic film and the substrate;
   a touch sensor disposed on the upper-layer inorganic film;

a sensor wiring disposed on the upper-layer inorganic film and connected to the touch sensor;

an inorganic film joining portion where the upper-layer inorganic film and the lower-layer inorganic film are directly joined together or joined together with another inorganic film interposed therebetween, the inorganic film joining portion being located in the outer edge area; and a contact portion located, in a plan view, in the inorganic film joining portion or on a side of the inorganic film joining portion opposite to the display area, the contact portion electrically connecting the sensor wiring with the lower-layer wiring, wherein the upper layer inorganic film includes a first upper layer inorganic film and a second upper layer inorganic film, the touchscreen includes a sealing film that is a multilayer film composed of the first upper layer inorganic film, an organic film, and a second upper layer inorganic film, the sealing film covering the plurality of light emitting elements, the first upper layer inorganic film is stacked on a surface of the upper electrode in the display area, the organic film is interposed between the first and second upper layer inorganic films in the display area, and the first and second upper layer inorganic films overlap and are in direct contact with each other in the outer edge area.

2. The touchscreen according to claim 1, wherein the touch sensor includes a sensor electrode composed of a conductive film stacked on a surface of the second upper-layer inorganic film.

3. The touchscreen according to claim 1, further comprising a connection terminal area where a connection terminal composed of the lower-layer wiring is disposed, the connection terminal area being adjacent to the outer edge area, wherein the contact portion is provided in the connection terminal area or a portion of the outer edge area that is adjacent to the connection terminal area.

4. The touchscreen according to claim 3, wherein a display terminal connecting to a display wiring used for driving the light-emitting element and a sensor terminal connecting to the sensor wiring via the contact portion are disposed as the connection terminal in the connection terminal area, and the touchscreen includes a flexible printed circuit including an overlap with the connection terminal area and connected in common to the display terminal and the sensor terminal.

* * * * *